United States Patent [19]

Igami et al.

[11] Patent Number: 5,379,276
[45] Date of Patent: Jan. 3, 1995

[54] DATA INFORMATION RECORDING/REPRODUCING APPARATUS WHICH MINIMIZES RECORD FAILURES

[75] Inventors: Eiichi Igami, Takatsuki; Syunji Kagamibashi, Neyagawa; Shoji Hasegawa, Hirakata; Isao Obata, Nara, all of Japan

[73] Assignee: Matsushita Electric Industrial Co., Ltd., Osaka, Japan

[21] Appl. No.: 159,150

[22] Filed: Nov. 30, 1993

[30] Foreign Application Priority Data

Dec. 7, 1992 [JP] Japan .................................. 4-326607
Nov. 19, 1993 [JP] Japan .................................. 5-290821

[51] Int. Cl.⁶ .......................... G11B 17/22; G11B 5/09
[52] U.S. Cl. ........................................ 369/32; 369/47; 369/58; 369/54
[58] Field of Search ................ 369/32, 33, 24, 54, 369/58, 59, 53, 48, 47, 124, 275.3, 44.28, 44.11; 360/48, 53, 72.2, 78.04; 371/30, 37.7, 31

[56] References Cited

U.S. PATENT DOCUMENTS 5,111,444 5/1992 Fukushima et al. ............... 369/58
5,161,143 11/1992 Fukushima et al. ............... 369/53
5,202,876 4/1993 Takagi et al. ...................... 369/58

FOREIGN PATENT DOCUMENTS 58-105365 6/1983 Japan .

*Primary Examiner*—Ali Neyzari
*Attorney, Agent, or Firm*—Wenderoth, Lind & Ponack

[57] ABSTRACT

An information recording reproducing apparatus is operable with a large-capacity recording medium and is operatively connected to a host computer. The apparatus has a cache memory for temporarily storing therein information transmitted from the host computer, and also has a write-back function and a write-through function. When recording using a write-back function designated by a recording designation flag, the maximum number of substitutions of defective sectors is automatically set to a given value for a write-back operation, and a mode display indicates that a write-back mode has been selected. The write-back operation is inhibited by a write-back inhibit flag according to the frequency of occurrence of the substitutions or the condition of a substitute area to thereby enhance the reliability of recording information.

13 Claims, 8 Drawing Sheets

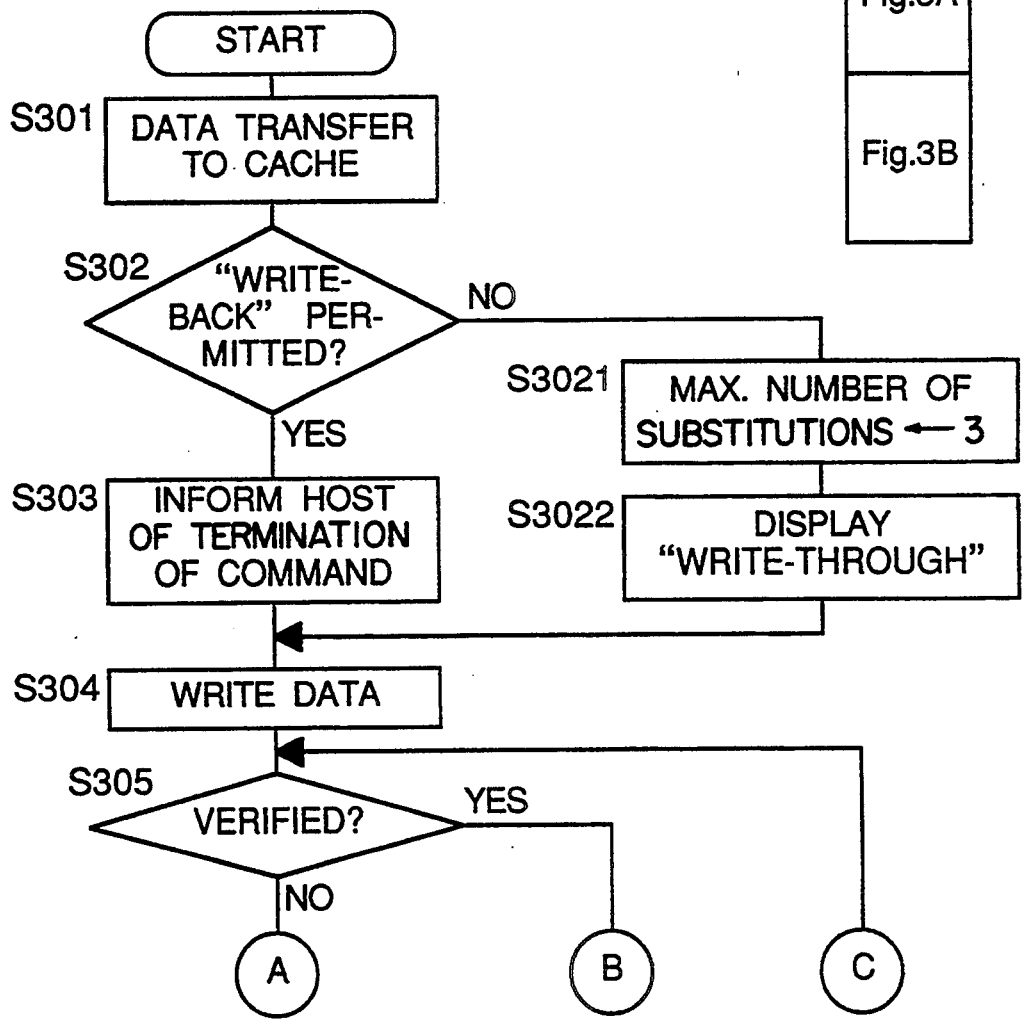

DATA INFORMATION RECORDING/REPRODUCING APPARATUS WHICH MINIMIZES RECORD FAILURES

BACKGROUND OF THE INVENTION

1. Field of the Invention

The present invention relates generally to an information recording reproducing apparatus and, more particularly, to data transmission between the information recording reproducing apparatus and a host apparatus, and also to a control for substitute processing to be executed with respect to a recording medium.

2. Description of the Prior Art

In recent years, in the information field, application programs or data are getting large in volume, and a large-sized information recording and/or reproducing apparatus has come to be required to accommodate such application programs or data. Of the various information recording reproducing apparatuses, an optical disc apparatus operable with a replaceable large-capacity media, i.e., optical disc is, therefore, considered to be an information recording reproducing apparatus conforming to recent demands.

The optical disc apparatus, however, requires during recording three steps of erasing information recorded on an optical disc, writing new information thereto and verifying the information newly recorded thereon, or at least two steps of writing and verifying. Because of this, the optical disc apparatus has a processing speed considerably lower than that of other information recording and/or reproducing apparatuses of a type which has a relatively low error rate and requires only the step of writing.

Japanese Laid-open Patent Publication (unexamined) No. 58-105365 discloses introducing the so-called "write-back" by making use of a "cache memory" of a relatively large capacity for temporarily storing information therein in order to increase the performance such as, for example, the response speed as viewed from a host apparatus or computer during recording. In this case, however, the manner in which defective sectors produced by dust or dirt adhering to the recording medium are substituted affects the reliability of the apparatus.

It is to be noted that the term "cache" referred to above is a method of increasing the apparent response speed, wherein a portion of a recording medium, for example a magnetic disc, which requires a relatively long time to access is copied on a semiconductor memory which requires an extremely short time to access so that subsequent recording or reproduction may be executed on or from the latter in place of the former. The semiconductor memory used for this purpose is called "cache memory", while a recording operation from the cache memory to the magnetic disc is called "write-back". On the other hand, recording directly on the magnetic disc and not through the cache memory is called "write-through".

The meaning of these terms is, however, extended throughout this application to define the term "write-through" as a function of informing the host computer of the end of execution of a data record instruction at the time of termination of actual recording on the recording medium, and also to define the term "write-back" as a function of informing the host computer of the end of execution of the data record instruction at the time of termination of data transfer to the cache memory before the actual recording on the recording medium is terminated.

Throughout this application, a buffer memory is regarded as a cache memory because the buffer memory is used as a temporary storage for temporarily storing information therein when the "write-through" function redefined above is utilized. The buffer memory is, therefore, considered to be equivalent to the cache memory.

In conventional information recording reproducing apparatuses, the maximum number of execution of substitutions of a defective sector is generally set to a small value, for example two or three, for the purpose of avoiding waste of substitute areas. In the event that all of the substitutions end in a failure, an error message indicating this fact is displayed on, for example, a CRT via the host computer.

Recording using the write-back function is hereinafter discussed with reference to FIGS. 6 and 7, on the premise that re-substitution at a substitute area has failed.

As shown in a flowchart of FIG. 6, data transferred from the host computer are first stored in the cache memory (step S61), and upon completion of the data storage, the host computer is informed that a command therefrom has normally been terminated (step S62). Thereafter, when a given condition is satisfied, for example, if a given length of time has elapsed, the data stored in the cache memory is written to a data area 72 of a recording medium 71 successively from a designated leading sector 74 towards succeeding sectors (step S63). If verification (steps S64 and S641) of all the sectors results in success, the command is considered to be normally terminated.

In the case of an example shown in FIG. 7, because there exists a sector 76 of which the verification has failed due to, for example, the presence of detects in the recording medium, i.e., the optical disc, a sector 77 of a substitute area 73 is substituted for the defective sector 76 (step S66). Thereafter, verification is executed as in the data area (step S67). If the verification of the substitute sector 77 has also failed, the number of substitutions is confirmed (step S68). If this number is less than a designated value (for example, three), further substitution is successively executed in which a sector 78 next to the defective sector 77 is substituted for the defective sector 77. In the case of the illustrated example, verification of the sector 78 has also failed and, hence, the next succeeding sector 79 is substituted therefor, thereby terminating the verification normally.

At this moment, if verification of the substitute sector 79 has also failed, the number of substitutions executed exceeds the designated value. In this case, the host computer is informed of an error indicating this fact, and a recording operation is terminated.

In the above-described construction, however, because the maximum number of substitutions allowed is set on the premise that the write-through function is utilized for the purpose of avoiding waste of substitute areas, re-substitutions of defective sectors at a certain substitute area may frequently occur due to contamination of the recording medium during recording by the use of the write-back function. In this case, although the host computer is informed that the command issued therefrom has normally been terminated simultaneously with termination of the data transfer to the cache memory, the host computer is later informed of an error indicating that the recording operation has not normally been executed due to the fact that the substitutions have not been completed within a given number of times, resulting in the condition in which restoration is not possible. This brings about a problem that such a recording failure results in a time lag between the host computer and the information recording reproducing apparatus or imposes upon the host computer the serious burden of searching and calling previous information which has been judged by the host computer as having already been processed. In some cases, such information cannot be called.

SUMMARY OF THE INVENTION

The present invention has been developed to overcome the above-described disadvantages and is intended to provide an improved reliable information recording reproducing apparatus capable of minimizing recording failures even when the write-back function is utilized.

In accomplishing the above and other objects, the information recording reproducing apparatus according to the present invention comprises an interface for operatively connecting the information recording reproducing apparatus and a host apparatus; a temporary storage means for temporarily storing therein data transmitted from the host apparatus via the interface, and a recording reproducing means for recording data stored in the temporary storage means on a recording medium or reproducing data recorded on the recording medium. The information recording reproducing apparatus further comprises a control means for controlling recording or reproduction by the recording reproducing means and a designation means for designating one of a write-back mode, at which the host apparatus is informed of the end of execution of a record instruction issued from the host apparatus to the recording medium at the time of termination of data transfer to the temporary storage means, and a write-through mode at which the host apparatus is informed of the end of execution of the record instruction at the time of termination of actual recording on the recording medium. The operation mode is switched between the write-back mode and the write-through mode by a switching means.

When a portion of the data stored in the temporary storage means is not correctly recorded on a specific sector of the data area, one of the sectors of the substitute area is substituted for the specific sector of the data area. The maximum number of substitutions for one sector allowed at the write-back mode differs from that allowed at the write-through mode, and preferably, the former is greater than the latter.

When the number of substitutions at the write-back mode has exceeded a given value or when the substitute area has been used more than a given extent or a given rate relative to the total area thereof, the switching means switches the operation mode from the write-back mode to the write-through mode.

Conveniently, the information recording reproducing apparatus has a mode display for displaying an operation mode selected.

Advantageously, the control means comprises a memory means for storing therein test data and a decision means for determining as to whether the test data are correctly recorded on and reproduced from a test area provided in the recording medium. In this case, when the decision means determines it difficult to correctly record and reproduce the test data on and from the test area, the switching means switches the operation mode from the write-back mode to the write-through mode. The test area is defined either in the substitute area or outside the data area and the substitute area.

Preferably, the recording reproducing means comprises a signal level detection means for detecting the signal level during reproduction and/or an error correction means for correcting errors during reproduction. When the signal level detected by the signal level detection means is less than a given level, or when the number of corrections executed by the error correction means exceeds a given value, the decision means determines it difficult to correctly record and reproduce the test data on and from the test area. The determination by the decision means is executed immediately after the recording medium has become accessible or when a given length of time has elapsed after the final access to the recording medium.

By the above-described construction, recording failures at the write-back mode can be minimized by increasing the number of substitutions at the substitute area. Furthermore, write-back failures due to an increase in the frequency of occurrence of the substitutions can be prevented by inhibiting the write-back operation based on the number of substitutions executed or the extent or the rate to or at which the substitute area has been used. Also, recording failures at the write-back mode which have hitherto been caused by contamination of the substitute area can be prevented by performing recording and reproduction on and from an unused portion of the substitute area for the purpose of determining as to whether such a portion is spoiled, and by inhibiting the write-back operation in accordance with the signal level, the number of error corrections, or the like.

In addition, according to the present invention, because the operator is informed of which one of the write-back and write-through modes is employed, the operator can readily know the operating condition of the apparatus. The switching from the write-back mode to the write-through mode can be utilized as a timing for disc cleaning or for apparatus servicing required to continuously maintain the reliability of recording information at a high level.

As a result, the apparatus according to the present invention is enhanced in both the high-speed response and the reliability to thereby reduce the load imposed upon the host computer.

BRIEF DESCRIPTION OF THE DRAWINGS

The above and other objects and features of the present invention will become readily understood from the following description of a preferred embodiment thereof with reference to the accompanying drawings, throughout which like parts are designated by like reference numerals, and wherein:

FIGS. 3A and 3B, when combined as shown in FIG. 3, is a flowchart indicating a write-back operation;

DETAILED DESCRIPTION OF THE PREFERRED EMBODIMENT

Figure 1:
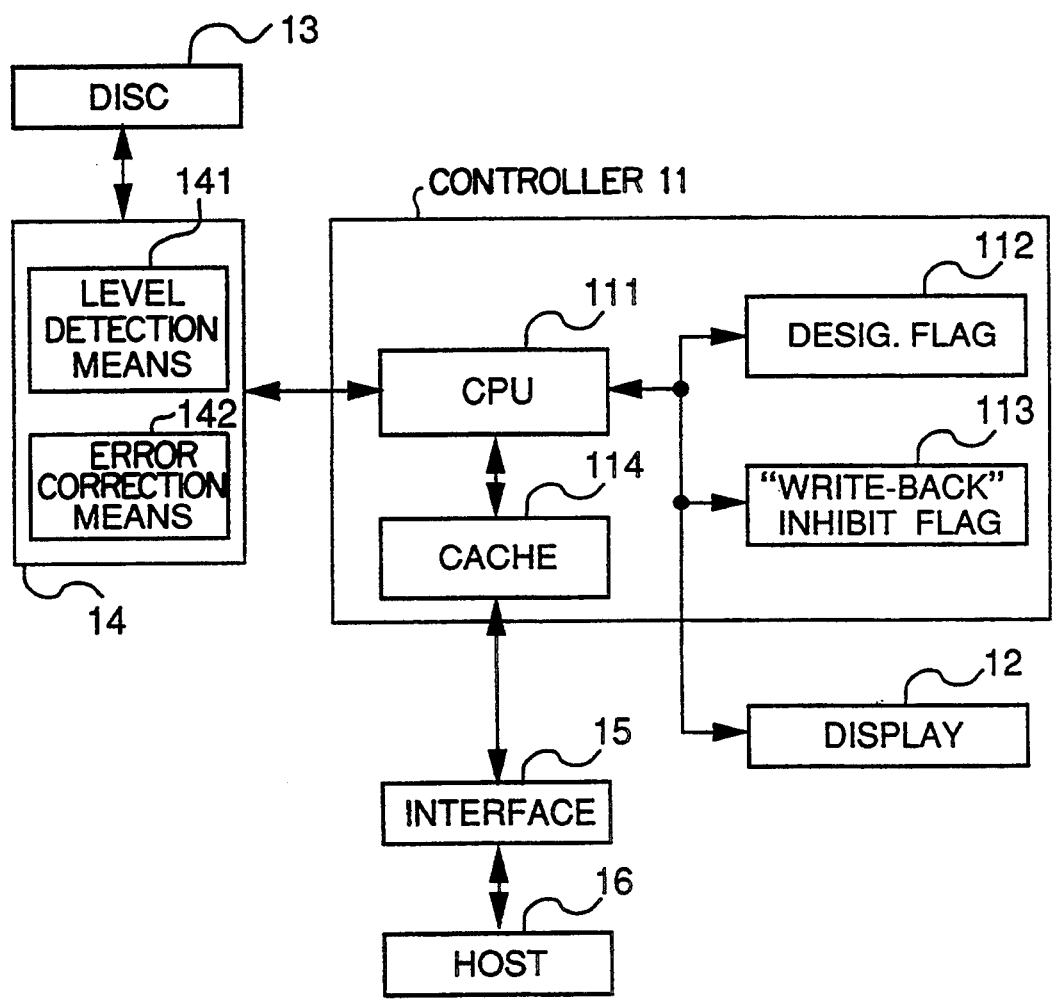
FIG. 1 is a block diagram of an information recording reproducing apparatus according to the present invention.

Referring now to the drawings, there is diagrammatically shown in FIG. 1 an information recording and/or reproducing apparatus embodying the present invention.

As shown in FIG. 1, the apparatus according to the present invention comprises a controller 11 and a recording reproducing mechanism 14 operatively connected with the controller 11. The apparatus is operable with an optical disc 13 and can be operatively connected with a host computer 16 via a host interface 15 as occasion demands.

The controller 11 comprises a CPU (central processing unit) 111, a cache memory 114, a recording designation flag 112 for designating a recording operation, and a write-back inhibit flag 113 for inhibiting the use of the write-back function.

In FIG. 1, where data transfer from the host computer 16 to the optical disc 13 is desired, data are initially temporarily stored in the cache memory 114 via the host interface 15. The CPU 111 then issues an instruction to the recording reproducing mechanism 14 and causes the recording reproducing mechanism 14 to write the data stored in the cache memory 114 to the optical disc 13. At this moment, whether the write-back function is used or not is determined by a value indicated by the recording designation flag 112 and that indicated by the write-back inhibit flag 113. An operator can select the kind of recording operation by setting the recording designation flag 112.

The controller 11 is also operatively connected with a mode display 12, which indicates the selection of a write-back mode only when the value of the recording designation flag 112 is indicative of the use of the write-back function and the write-back inhibit flag 113 permits it, and indicates the selection of a write-through mode in other cases.

The mode display 12 may be comprised of two separate LEDs for indicating the write-back mode and the write-through mode, respectively, or an LED unit having two LEDs for indicating them in two different colors. Alternatively, the mode display 12 may be a CRT for displaying a warning indicating switching from the write-back mode to the write-through mode. The host computer 16 is informed of this warning via the host interface 15.

When a recording operation has been designated by the operator, the information recording reproducing apparatus of the above-described construction operates as follows.

Figure 2:
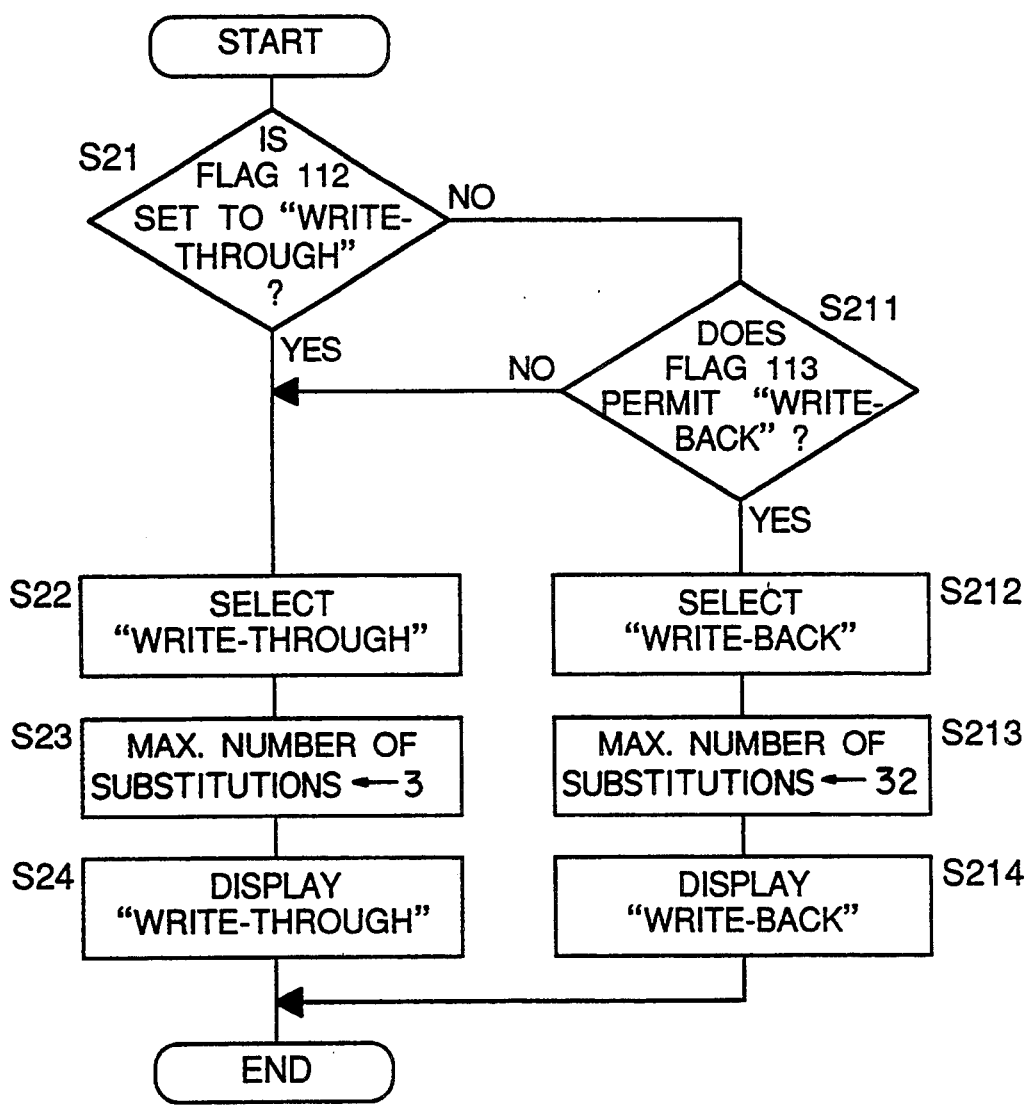
FIG. 2 is a flowchart indicating switching between a write-through mode and a write-back mode.

As shown in FIG. 2, where recording by the use of the write-through function is desired, the recording designation flag 112 is initially set to a value corresponding thereto by, for example, a manual switch (step S21), thereby selecting the write-through mode (step S22). Thereafter, the maximum value in the number of substitutions to be executed is set to a standard value (step S23), and the mode display 12 indicates the selection of the write-through mode (step S24). The standard value is, for example, three and is designated by either the apparatus or the operator.

On the other hand, where recording by the use of the write-back function is desired, the recording designation flag 112 is initially set to a value corresponding thereto (step S21). In this case, however, the write-back inhibit flag 113 is subsequently checked (step S211). If the write-back inhibit flag 113 indicates permission of the write-back operation, the write-back mode is selected (step S212). At this moment, the maximum value in the number of substitutions to be executed is automatically set to a value, for example 32, designated for the write-back operation (step S213), and the mode display 12 indicates the selection of the write-back mode (step S214).

It is to be noted that the maximum value in the number of substitutions at the write-back mode may be equal to the standard value at the write-through mode, but is preferably greater than the latter.

The recording operation, at the time the recording by the use of the write-back function has been designated by the operator, is discussed hereinafter with reference to FIGS. 3 and 4 each indicating a flow of the write-back operation and to FIG. 7 indicating that re-substitution at a substitute area has failed. Let it be assumed that the write-back inhibit flag 113 is set to a value to permit the write-back operation.

Data transferred from the host computer 16 to the information recording and/or reproducing apparatus are initially stored in the cache memory 114 (step S301). Upon completion of data storage in the cache memory 114, the host computer 16 is informed of normal termination of a command therefrom (step S303). Thereafter, when a given condition is satisfied, for example, if a given length of time has elapsed, the data stored in the cache memory 114 are written to a data area 72 of a recording medium 71 successively from a designated leading sector 74 towards succeeding sectors (step S304). If verification (step S305) of all the sectors results in success, the command is considered to be normally terminated.

Figure 7:
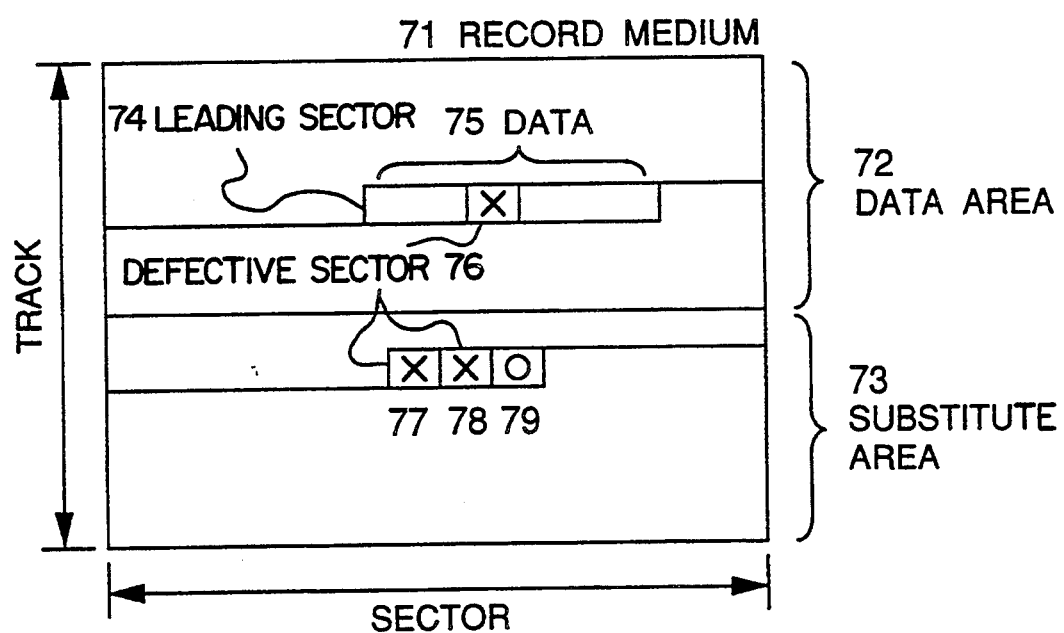
FIG. 7 is a schematic diagram indicating conventional substitute processing.

In the case of the example shown in FIG. 7, because there exists a sector 76 of which the verification has failed, a sector 77 of a substitute area 73 is substituted for the defective sector 76 (step S307). Thereafter, verification is executed as in the data area (step S308). If the verification of the substitute sector 77 has also failed, the number of substitutions is confirmed (step S309). If this number is less than the designated value (for example, 32) at the write-back mode, further substitution is successively executed in which a sector 78 next to the defective sector 77 is substituted for the defective sector 77. In the case of the illustrated example, verification of the sector 78 has also failed and, hence, the next succeeding sector 79 is substituted therefor, thereby terminating the verification normally.

At this moment, even if verification of the substitute sector 79 has failed, the host computer 16 is not informed of an error message indicating that the substitutions have not succeeded within the given number because the number thereof does not exceed the designated value. In this way, a sequence of processes is terminated.

On the other hand, where the write-back inhibit flag 113 is set to a value to inhibit the use of the write-back function, the maximum value in the number of substitutions is restored to the standard value (step S3021), and the mode display 12 indicates that the write-through mode has been selected (step S3022). Upon completion of an actual recording operation, the host computer 16 is informed of the termination of the recording operation (3111). In this way, the recording is executed using the write-through function, regardless of the designation of the write-back mode.

Figure 3B:
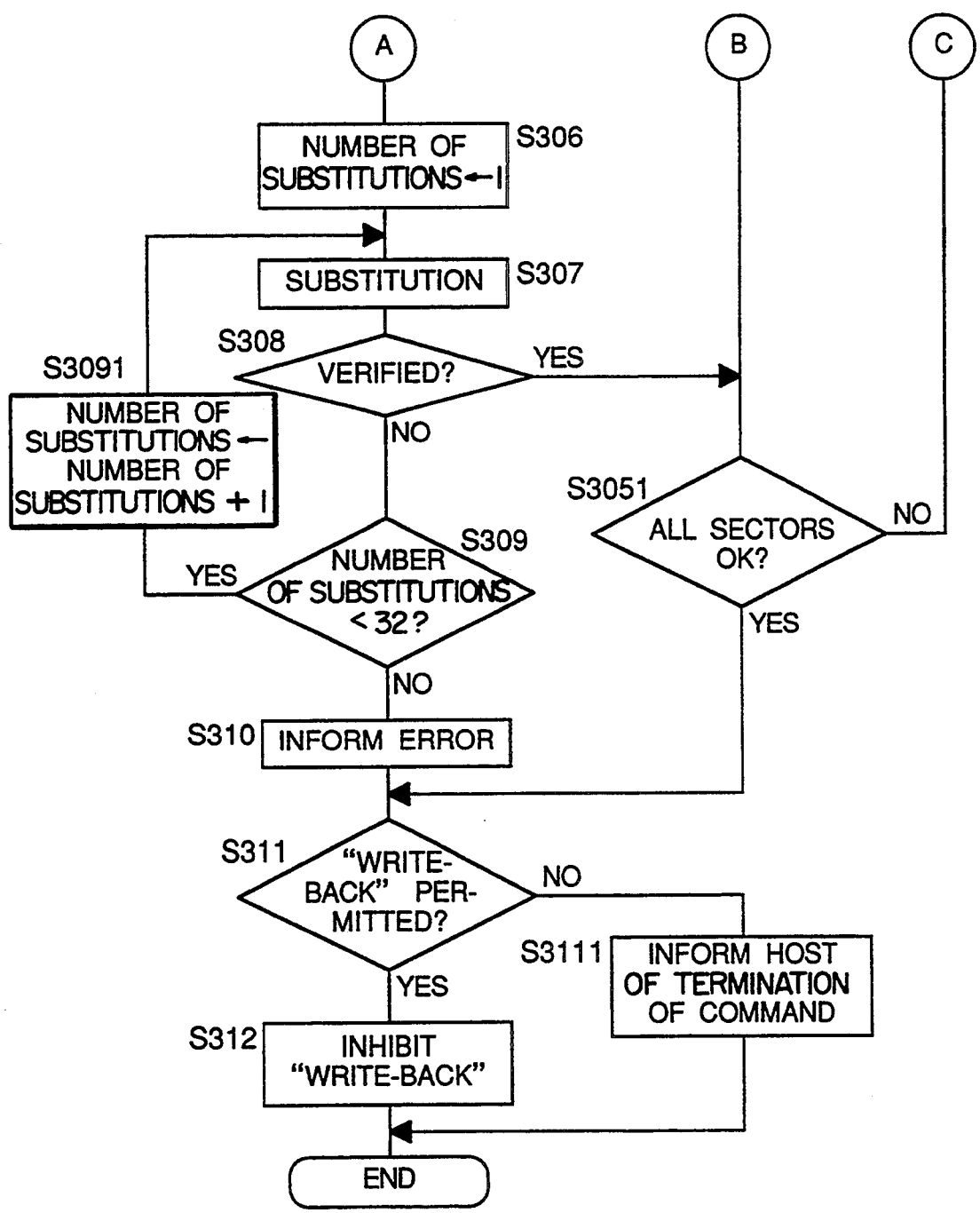

As shown in FIG. 3 (FIGS. 3A and 3B), the write-back inhibit flag 113 is set, for example, according to a given condition, at the final step (step S312) during the write-back operation.

Figure 4:
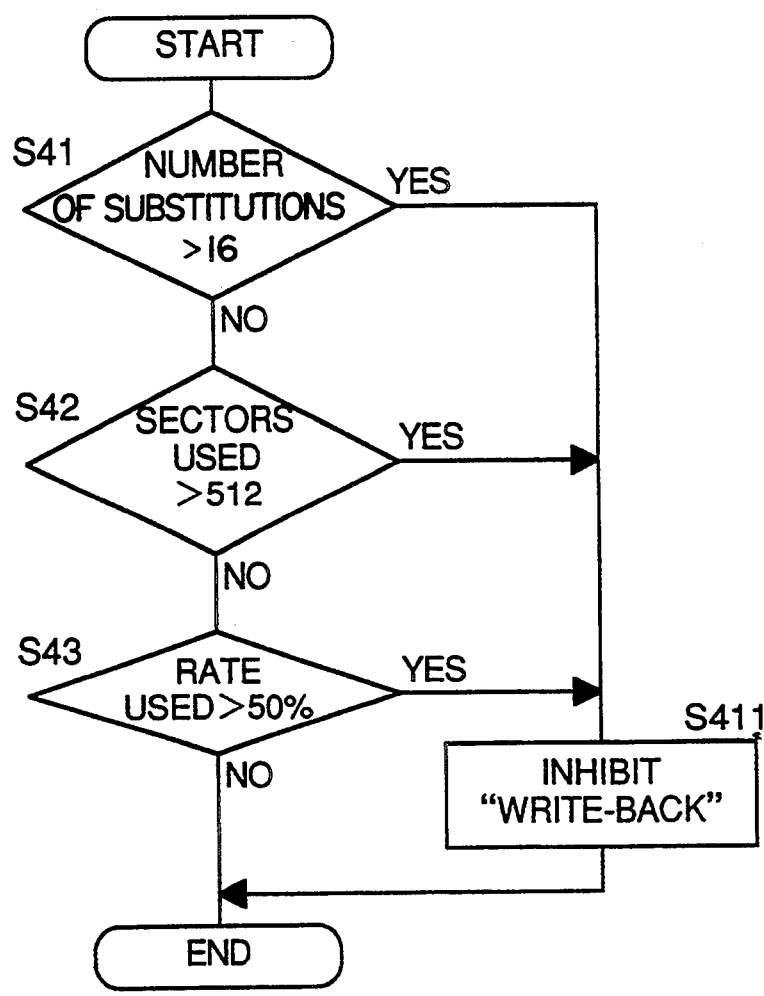
FIG. 4 is a flowchart indicating the process of setting a write-back inhibit flag.

More specifically, as shown in FIG. 4, the number of substitutions actually executed in one sector is first checked (step S41). If this value exceeds a designated value (for example, 16), the write-back inhibit flag 113 inhibits the write-back operation (step S411). Second, the extent to which the substitute area 73 has been used is checked (step S42). If the substitute area 73 has been used more than a given extent (for example, 512 sectors), the write-back inhibit flag 113 inhibits the write-back operation. Third, the rate at which the substitute area 73 has been used is checked (step S43). If the substitute area 73 has been used more than a given rate (for example, 50%), the write-back inhibit flag 113 inhibits the write-back operation.

In this embodiment, although the three conditions, i.e., the number of substitutions executed, the extent to which the substitute area 73 has been used, and the rate at which the substitute area 73 has been used are all confirmed, the reliability of information to be recorded can be ensured by the use of only one or two conditions.

As shown in FIG. 1, the recording and/or reproducing mechanism 14 preferably has a signal level detection means 141 and an error correction means 142. In this case, at the time of replacement of the recording medium or when a given length of time has elapsed after the final access thereto, a determination is made, prior to the recording, as to whether the write-back operation is possible. To this end, a test is carried out to determine as to whether that portion of the substitute area that is to be next used is dirty or damaged or as to whether a recording medium to be next used is defective to the extent of being incapable of ensuring the recording reliability. The test result is checked by a decision means provided in the CPU 111.

The signal level detection means 141 detects the level of amplitude of a signal obtained from the optical disc 13, compares it with a predetermined reference level (voltage), and determines as to whether the detected level is greater than the reference level or as to whether there is no level, though partially, below the reference level. To this end, the signal level detection means 141 is comprised of, for example, an envelope detection circuit, a voltage comparator, an interface required for signal transmission with the CPU 111, and the like. The result of the determination by the signal level detection means 141 is sent, as signals of "1" or "0" or pulse signals, to the CPU 111.

It is to be noted that the signal level detection means 141 is not a specific means dedicated for use in the apparatus according to the present invention. This means is generally provided in an apparatus for recording or reproducing information, for example, to confirm the presence or absence of a recording signal. To further enhance the reliability of the recording signal, the use of a separate signal level detection means is effective with the reference voltage level lowered.

The error correction means 142 adds, during recording, a signal required to remove errors and recover a defective sector by performing a particular operation. During reproduction, the error correction means 142 confirms the occurrence of errors by performing an operation reverse to said particular operation, to thereby recover the defective sector.

Like the signal level detection means 141, the error correction means 142 is not a specific means dedicated for use in the apparatus according to the present invention, and is generally provided in any other information recording reproducing apparatus to confirm the reliability of the recording signal or to remove errors.

The operation stated above is discussed hereinafter with reference to FIG. 5.

Test data, stored in and sent from a memory provided in the CPU 111, are initially written to that portion of the substitute area 73 that is next used (step S51). Immediately thereafter, data recorded on such a portion are reproduced (step S52). The signal level detection means 141 detects the signal level during reproduction, while the error correction means 142 corrects errors of reproduced binary data and counts the number of corrections. At this moment, if the signal level in amplitude is, either almost entirely or partially, less than the reference level, or if the number of corrections counted exceeds a predetermined number, or if errors which cannot be recovered have occurred (steps S53 and S54), the write-back inhibit flag 113 is set to inhibit the write-back operation (step S531).

In the above-described embodiment, although the reliability of the test data has been checked immediately after the recording thereof, the check in reliability may be carried out at the time a predetermined period of time has elapsed after the recording. The reason for this is that there are some recording media which require a certain period of time until the signal amplitude is settled at a final one according to properties of recording material.

Furthermore, in this embodiment, although the two conditions, i.e., the signal level of the test data during reproduction and the number of error corrections have both been confirmed, confirmation of any one of them is also effective in determining the reliability of the recording signal, for example, in determining as to whether the substitute area is dirty or damaged, or there exist defects which may have been produced during the manufacture of the recording medium.

These processes may be executed at the time the apparatus is powered on, immediately before or after the recording operation, immediately before or after the necessity of substitution has arisen, or cyclically at intervals of a predetermined time. The quality of a specific sector of the data area or the substitute area can be also known from the number of retrying recording or reproduction when the recording or reproduction has first failed.

Figure 5:
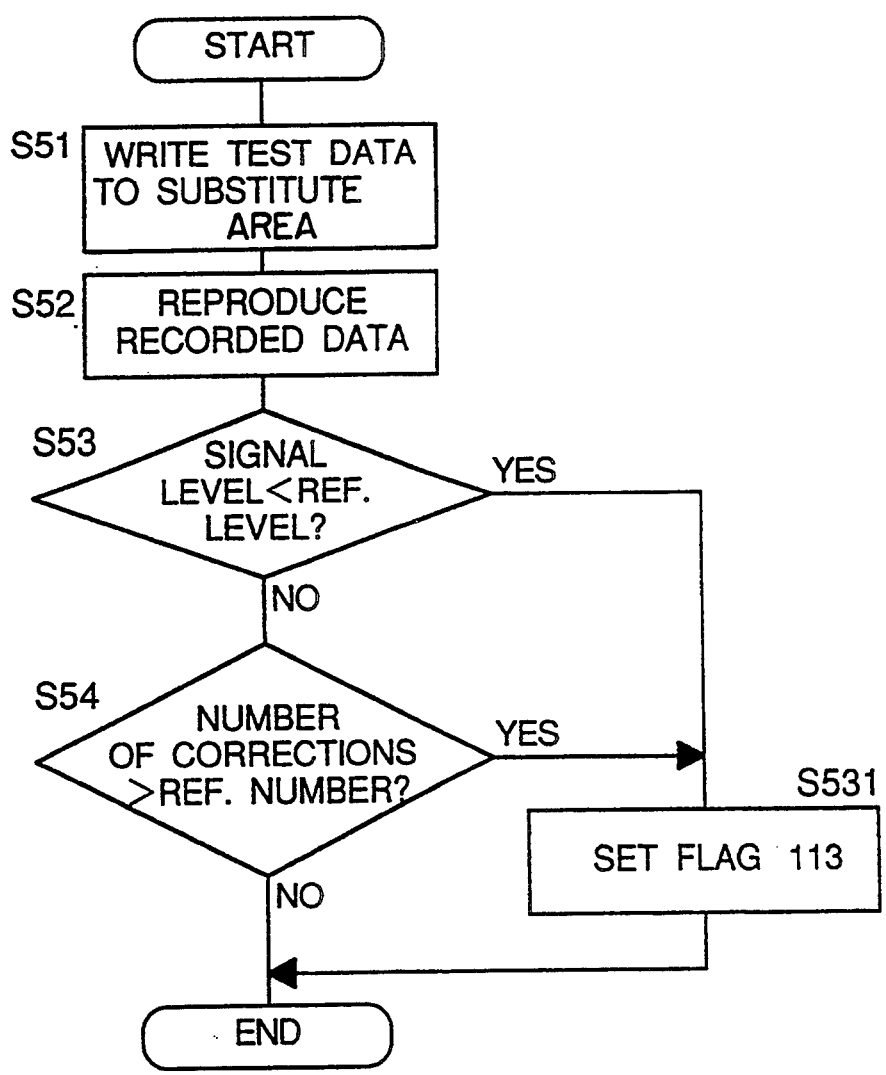
FIG. 5 is a flowchart indicating the process of setting the write-back inhibit flag at the time test recording is carried out on a substitute area.
Figure 6:
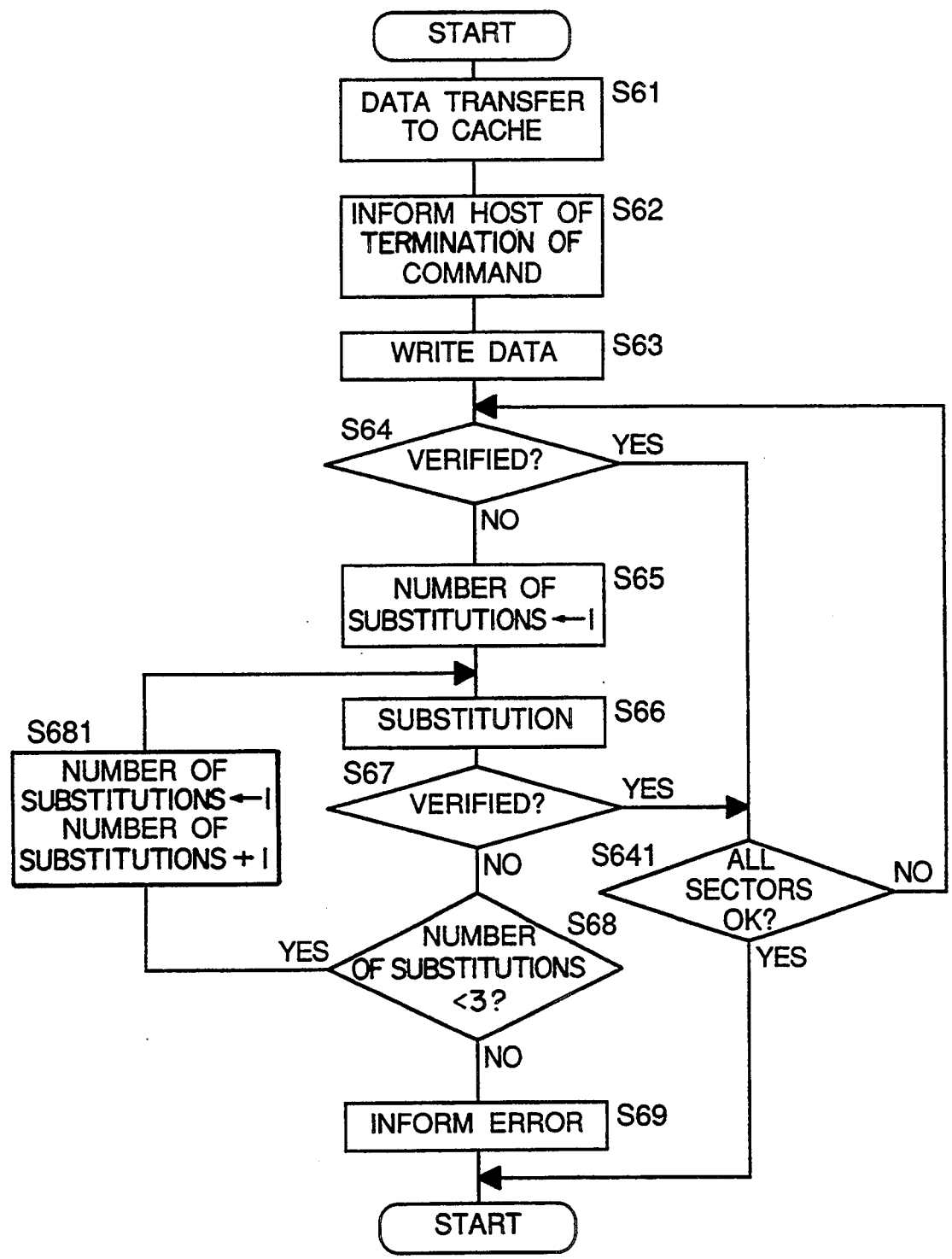
FIG. 6 is a flowchart indicating a conventional write-back operation.

In the flowchart of FIG. 5, the write-back operation is automatically inhibited if the substitute area is defective. Similar processes may be executed with respect to a test sector positioned outside the data area 72 and the substitute area 73 in order to prevent recording failures at the data area which may occur if the recording and/or reproducing mechanism 14 is spoiled.

Furthermore, if the write-back operation is inhibited as a result of a recording test conducted with respect to the test sector, it is effective for the operator to be informed of this fact by any suitable means such as, for example, LEDs. By doing so, the operator is urged to clean the optical disc or an objective lens disposed on an optical head which is used to record or reproduce information on or from the optical disc. Alternatively, the information recording reproducing apparatus may be provided with an automatic cleaning mechanism for automatically cleaning the objective lens. The cleaning of the objective lens is effective and important to maintain the reliability of the recording signal or not to reduce the response speed when information is being recorded.

In the above-described embodiment, the reliability of information to be recorded is ensured by increasing the maximum value in the number of substitutions at the write-back mode, and the reliability is taken seriously rather than the high-speed response in view of safety by switching the operation mode to the write-through mode upon checking the number of substitutions, the extent to which the substitute area has been used, or the like.

It is, however, conceivable that the number of required substitutions exceeds the increased maximum number at the write-back mode, though the probability is very low. In this case, although it is possible to render the host computer to deal with abnormal processing and to perform re-recording after the operation mode has been switched to the write-through mode according to the substitute conditions, the load imposed upon the host computer is slightly increased. Alternatively, as discussed previously, the extent to which the substitute area is spoiled can be checked by the test recording conducted in advance with respect to the substitute area. If it is considered that there are many factors which may cause recording failures, it is preferred that the operation mode is switched to the write-through mode, thereby not only enhancing the reliability of the recording signal, but also providing a high-speed response. As a result, the load imposed upon the host computer is considerably reduced. However, in applications where recording of target information including the substitute processing has not been completed at the write-back mode, it is very effective for the optical disc apparatus, in which the reliability of information is taken seriously, to solely repeatedly execute the incompletely executed command from the host computer until the recording is completed with the operation mode switched to the write-through mode.

As discussed hereinabove, according to the present invention, the response speed, as viewed from the host computer, is considerably increased by judging at the time information to be recorded is temporarily stored in the cache memory that recording on the recording medium has been terminated. Furthermore, a reduction in reliability of information due to non-confirmation of the recording on the recording medium can be sufficiently compensated for by increasing the maximum value in the number of substitutions during the write-back operation, thereby enhancing the reliability of the recorded information and providing a high-speed response.

A semiconductor memory, a magnetic memory, or an optical memory is preferably employed as the cache memory. It is, however, sufficient if temporary storage is terminated within a time period shorter than the time period required for actually writing information to a large-capacity recording medium such as, for example, the optical disc. The cache memory is required to have a storage capacity greater than the information content which is normally sent thereto from the host computer at one time.

The present invention is not limited by the optical disc apparatus, but is applicable to any information recording reproducing apparatus of a magnetic type, an optical type, or any other type capable of recording or reproducing information in response to a command from a host apparatus or computer.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. An information recording/reproducing apparatus operable with a recording medium having at least one data area and at least one substitute area defined therein, each of said data area and said substitute area having a plurality of sectors defined therein, said information recording/reproducing apparatus being operatively connected with a host apparatus and comprising:

an interface for operatively connecting said information recording/reproducing apparatus and said host apparatus;
a temporary storage means for temporarily storing therein data transmitted from said host apparatus via said interface;
a recording/reproducing means for recording data stored in said temporary storage means on said recording medium or reproducing data recorded on said recording medium;
a control means for controlling recording or reproduction by said recording/reproducing means;
a designation means, operatively connected with said control means, for designating one of a first mode, at which said host apparatus is informed of an end of execution of a record instruction issued from said host apparatus to said recording medium at the time of termination of data transfer to said temporary storage means, and a second mode at which said host apparatus is informed of the end of execution of the record instruction at the time of termination of actual recording on said recording medium; and
a switching means, operatively connected with said control means, for switching an operation mode between the first mode and the second mode;
wherein, when a portion of the data stored in said temporary storage means is not correctly recorded on a specific sector of the data area, one of the sectors of the substitute area is substituted for the specific sector of the data area, and
wherein a maximum number of substitutions allowed at the first mode differs from that allowed at the second mode.

2. The information recording/reproducing apparatus according to claim 1, wherein when the number of substitutions at the first mode has exceeded a given value, said switching means switches the operation mode from the first mode to the second mode.

3. The information recording/reproducing apparatus according to claim 1, wherein when the substitute area has been used more than a given extent, said switching means switches the operation mode from the first mode to the second mode.

4. The information recording/reproducing apparatus according to claim 1, wherein when the substitute area has been used more than a given rate relative to a total area thereof, said switching means switches the operation mode from the first mode to the second mode.

5. The information recording/reproducing apparatus according to claim 1, further comprising a mode display for displaying an actual operation mode selected.

6. The information recording/reproducing apparatus according to claim 1, wherein the maximum number of substitutions allowed at the first mode is greater than that allowed at the second mode.

7. The information recording/reproducing apparatus according to claim 1, wherein said control means comprises a memory means for storing therein test data and a decision means for determining as to whether the test data are correctly recorded on and reproduced from a test area provided in said recording medium, and wherein when said decision means determines it difficult to correctly record and reproduce the test data on and from the test area, said switching means switches the operation mode from the first mode to the second mode.

8. The information recording/reproducing apparatus according to claim 7, wherein said test area is defined in the substitute area.

9. The information recording/reproducing apparatus according to claim 7, wherein said test area is defined outside the data area and the substitute area.

10. The information recording/reproducing apparatus according to claim 7, wherein said recording/reproducing means comprises a signal level detection means for detecting a signal level during reproduction, and wherein when the signal level detected by said signal level detection means is less than a given level, said decision means determines it difficult to correctly record and reproduce the test data on and from the test area.

11. The information recording/reproducing apparatus according to claim 7, wherein said recording/reproducing means comprises an error correction means for correcting errors during reproduction, and wherein when the number of corrections executed by said error correction means exceeds a given value, said decision means determines it difficult to correctly record and reproduce the test data on and from the test area.

12. The information recording/reproducing apparatus according to claim 7, wherein a determination by said decision means is executed immediately after said recording medium has become accessible.

13. The information recording/reproducing apparatus according to claim 7, wherein a determination by said decision means is executed when a given length of time has elapsed after a final access to said recording medium.

* * * * *